(12) United States Patent
Vig et al.

(10) Patent No.: US 7,552,016 B2
(45) Date of Patent: Jun. 23, 2009

(54) INTEGRATED CIRCUIT HAVING A MULTI-PURPOSE NODE CONFIGURED TO RECEIVE A THRESHOLD VOLTAGE AND TO PROVIDE A FAULT SIGNAL

(75) Inventors: Ravi Vig, Bow, NH (US); John Cummings, Nashua, NH (US); Jonathan Lamarre, Pembroke, NH (US); David J. Haas, Weare, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 5 days.

(21) Appl. No.: 11/755,295

(22) Filed: May 30, 2007

(65) Prior Publication Data

US 2008/0297242 A1    Dec. 4, 2008

(51) Int. Cl.
*G01R 31/00* (2006.01)
*G01R 31/04* (2006.01)
(52) U.S. Cl. ......................................... 702/58; 324/538
(58) Field of Classification Search .................. 702/58, 702/64, 65, 79; 324/512, 760, 763, 765; 327/525; 323/283; 361/86, 88
See application file for complete search history.

(56) References Cited

U.S. PATENT DOCUMENTS 5,025,344 A * 6/1991 Maly et al. .................... 361/88

| | | | |
|---|---|---|---|
| 5,710,515 A * | 1/1998 | Teggatz et al. | 324/763 |
| 5,818,251 A * | 10/1998 | Intrater | 324/765 |
| 6,693,782 B1 * | 2/2004 | Lash | 361/93.9 |
| 2006/0259256 A1 | 11/2006 | Roach | |

FOREIGN PATENT DOCUMENTS

JP         58088672         5/1983

OTHER PUBLICATIONS

"12 V High-Side Hot-Swap Hall Effect Based Current Monitor;" ACS760ELF-20B; Aug. 9, 2006; pp. 1-15.
PCT Search Report and Written Opinion of the ISA for PCT/US2008/063400 dated Sep. 4, 2008.

* cited by examiner

*Primary Examiner*—Bryan Bui
(74) *Attorney, Agent, or Firm*—Daly, Crowley, Mofford & Durkee, LLP

(57) ABSTRACT

An integrated circuit includes a monitor node adapted to receive a monitored signal. The integrated circuit also includes a multi-purpose node. The integrated circuit is adapted to receive and store a threshold presented at the multi-purpose node during a first time period. The integrated circuit is also adapted to output a fault signal from the multi-purpose node at a time after the predetermined time period. The fault signal is indicative of a relationship between the monitored signal and the threshold. With this arrangement, the multi-purpose node achieves at least two functions.

12 Claims, 2 Drawing Sheets

INTEGRATED CIRCUIT HAVING A MULTI-PURPOSE NODE CONFIGURED TO RECEIVE A THRESHOLD VOLTAGE AND TO PROVIDE A FAULT SIGNAL

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, to fault detecting integrated circuits adapted to compare a received signal with a threshold to detect a fault in the received signal.

BACKGROUND OF THE INVENTION

Fault detection circuits are known. A conventional fault detection circuit can compare an input (monitored) voltage signal to a threshold voltage, and can generate a fault output signal in accordance with the comparison. For example, in some fault detection circuits, if the monitored voltage signal is greater than the threshold voltage, a fault output signal generated by the fault detection circuit changes state, for example, from a high state to a low state.

Some conventional fault detection circuits use at least one integrated circuit pin in order to receive the threshold voltage and at least one other integrated circuit pin in order to output the fault output signal.

It is known that it is generally desirable to reduce pin count of an integrated circuit. Some other conventional fault detection circuits use a fixed internal threshold that is not settable by a user, and therefore, do not require one or more pins to receive the threshold voltage. However, it is generally desirable to provide a user settable threshold.

SUMMARY OF THE INVENTION

The present invention provides an integrated circuit having a multi-purpose node, or pin, having at least two functions. A threshold voltage can be sensed at the multi-purpose node during a predetermined time period and a fault signal can be output from the multi-purpose node after the predetermined time period.

In accordance with one aspect of the present invention, an integrated circuit includes a monitor node adapted to receive a monitored signal. The integrated circuit also includes a multi-purpose node. The multi-purpose node is configured to couple to a resistor external to the integrated circuit. The integrated circuit is adapted to provide a predetermined current at the multi-purpose node during a predetermined time period, resulting in a resistor voltage upon the resistor during the predetermined time period. The integrated circuit is adapted to sense the resistor voltage, which is indicative of a threshold value. The integrated circuit is also adapted to store the threshold value. The integrated circuit is further adapted to output a fault signal from the multi-purpose node at a time after the predetermined time period. The fault signal is indicative of a relationship between the monitored signal and the threshold value. With this arrangement, the multi-purpose node achieves at least two functions.

In accordance with another aspect of the present invention, a method of detecting a fault associated with a monitored signal includes detecting a detected voltage at a multi-purpose node during a predetermined time period, wherein the detected voltage is representative of a threshold value. The method further includes storing the threshold value in response to the detecting, and outputting a fault signal from the multi-purpose node at a time after the predetermined time period. The fault signal is indicative of a relationship between the monitored signal and the threshold value. With this method, the multi-purpose node achieves at least two functions.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. While signal voltages and threshold voltages are described below, it should be apparent that equivalent circuits can be constructed which employ signal currents and/or threshold currents in place of the signal voltages and threshold voltages.

As used herein the term "current generator" is used to describe either a current source or a current sink. Where a particular circuit topology is shown below that uses a current source and a current sink, it should be apparent that, in other embodiments, with some circuitry changes, either one of the current source or the current sink can be replaced by a current generator of the other type.

As used herein, the term "reference voltage" refers to any DC voltage source, including, but not limited to, a power supply voltage source and a ground.

Figure 1:
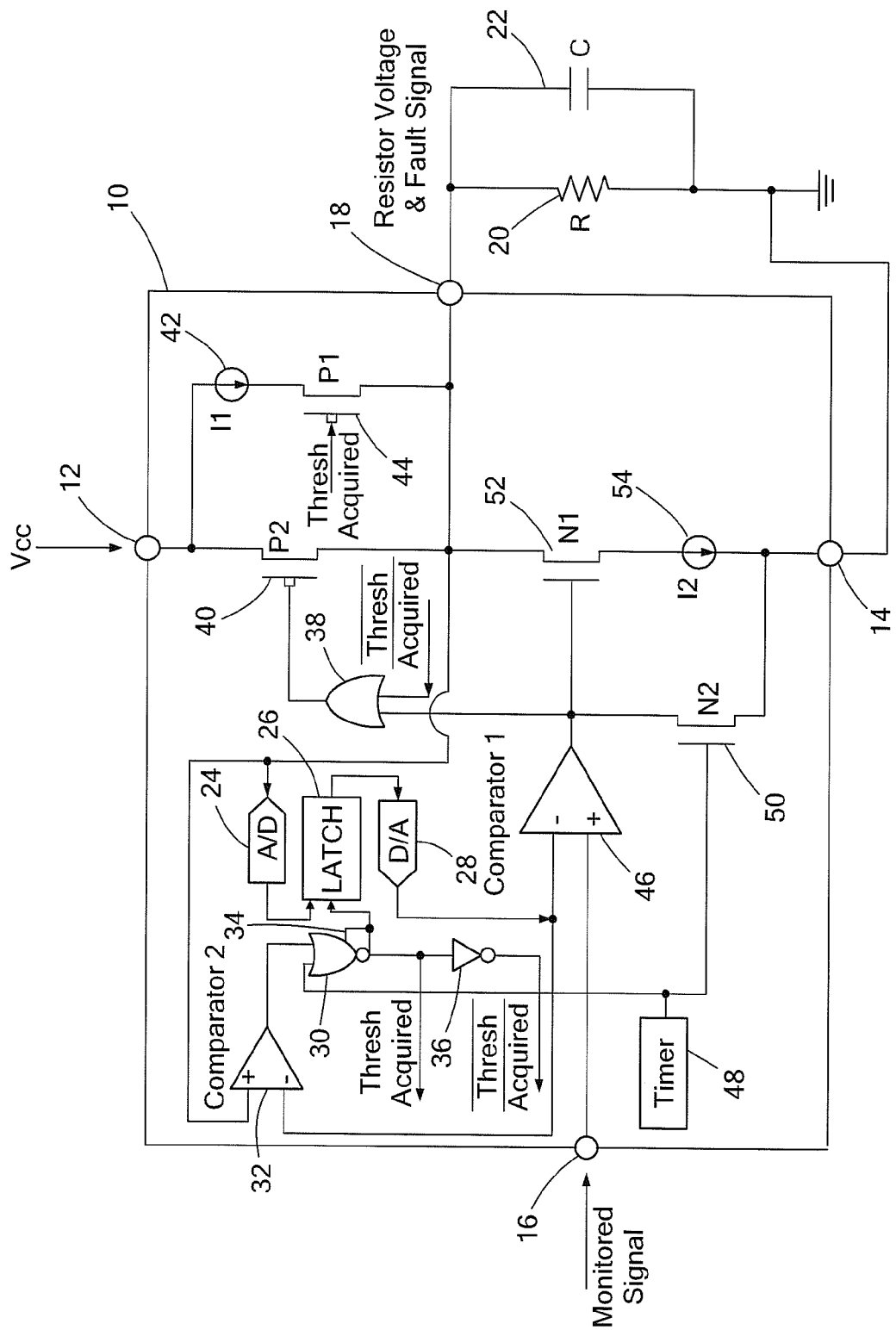
FIG. 1 is a schematic diagram showing an exemplary integrated fault detection circuit having a multi-purpose node in accordance with the present invention.

Referring to FIG. 1, an integrated circuit 10 includes a power supply node 12, a ground node 14, an input node 16 (also referred to herein as a monitor node), and a multi-purpose node 18. The monitor node 16 is configured to receive a signal being monitored, i.e., a monitored signal.

While the monitored signal is shown to come from outside the integrated circuit 10, in some other arrangements, the monitor node 16 is internal to the integrated circuit 10, and the monitored signal is a signal internal to the integrated circuit 10. For example, in some arrangements, the integrated circuit 10 can include a magnetic field sensor (not shown), and the monitored signal is representative of an output signal from the magnetic field sensor.

It will become apparent from discussion below that the multi-purpose node 18 can have at least two modes of operation. It should be appreciated that each of the nodes 12-18 can be associated with, e.g., coupled to, a pin of the integrated circuit 10. Thus, the integrated circuit needs only four pins. However, the integrated circuit 10 needs only three pins if the monitor node 16 and associated monitored signal are internal to the integrated circuit 10 in alternate arrangements described above.

In a first mode of operation, within a predetermined time period, the multi-purpose node 18 can receive a threshold voltage, which is thereafter stored within the integrated circuit 10 as a threshold value and associated threshold voltage. In a second mode of operation, at a time after the predetermined time period, the integrated circuit 10 can compare the monitored signal received at the monitor node 16 with the stored threshold voltage and can generate a fault output signal at the multi-purpose node 18 in accordance with the comparison. To this end, for reasons discussed more fully below, a resistor 20 external to the integrated circuit 10 is coupled between the multi-purpose node 18 and the ground node 14, and optionally, a capacitor 22 external to the integrated circuit 10 is coupled in parallel with the resistor 20.

The integrated circuit 10 can include a current source 42 coupled between the power supply node 12 and a drain node of a first field effect transistor (FET) 44. A source node of the first FET 44 can couple to the multi-purpose node 18.

The integrated circuit can also include a second FET 52, having a drain node coupled to the multi-purpose node 18. A current sink 54 can couple between a source node of the second FET 52 and the ground node 14.

The integrated circuit 10 can also include a third FET 40 having a drain node coupled to the power supply node 12 and a source node coupled to the multi-purpose node 18. A first logic gate 38, here an OR gate, has an output node coupled to a gate node of the third FET 40, and also has two input nodes. A first comparator 46 has an output node coupled to one of the two input nodes of the first logic gate 38 and also coupled to a gate node of the second FET 52. The first comparator 46 also has an input node coupled to the monitor node 16.

The integrated circuit 10 can also include a fourth FET 50 having a drain node coupled to the output node of the first comparator 46 and having a source node coupled to the ground node 14.

The integrated circuit 10 can also include an analog-to-digital (A/D) converter 24 having an input node coupled to the multi-purpose node 18 and a digital output port coupled to a digital input port of a latch 26. The digital output port of the A/D converter 24 can have any number of bits, even one bit. In some embodiments, the digital output port of the A/D converter 24 has eight bits. The latch 26 can have a digital output port coupled to a digital input port of a digital-to-analog (D/A) converter 28. The D/A converter 28 can have an output node, which will be understood to generate an analog output voltage, which is coupled to another input node of the first comparator 46.

The integrated circuit 10 can also include a second comparator 32 having an input node coupled to the multi-purpose node 18 and having an output node coupled to an input node of a second logic gate 30, here a NOR gate. An output node of the second logic gate 30 can couple to a control node of the latch 26 and also to an input node of an inverter 36. The output node of the second logic gate 30 can also couple to a gate node of the first FET 44. An output node of the inverter 36 can couple to another input node of the first logic gate 38. Another input node of the second comparator 32 can couple to the output node of the D/A converter 28.

The integrated circuit 10 can also include a timer circuit, which is also commonly referred to as a monostable multivibrator or as a "one-shot." The timer circuit 48 is adapted to generate a pulse signal, for example, upon integrated circuit power on, having a pulse width in accordance with and controlling the above-described predetermined time period in which the integrated circuit 10 achieves the first mode of operation. The pulse signal is coupled to another input node of the second logic gate 30 and also coupled to a gate node of the fourth FET 50.

In operation, upon power up of the integrated circuit, e.g., upon application of a Vcc voltage to the power supply node 12, the timer circuit 48 generates a change of state of the above-described pulse signal, the pulse width of which determines the above-described predetermined period of time during which the integrated circuit 10 operates in the first mode of operation.

Furthermore, upon power up of the integrated circuit 10, an output signal at the output node of the D/A converter 28 is low, resulting in a high signal at the output node of the second comparator 32, which holds a low state at the output node of the second logic gate 30, which results in a low state at the gate node of the first FET 44, which turns on the first FET 44, allowing current from the current source 42 to pass through the external resistor 20. The current from the current source 42 flowing through the external resistor 20 results in a voltage at the multi-purpose node 18. The voltage at the multi-purpose node 18 is determined by the amount of current from the current source 42, which is predetermined, and also by the value of the resistor 20. The resistor 20 can be selected by a user in order to result in a desired voltage at the multi-purpose node 18 when the integrated circuit 10 is in the first mode of operation. It will become apparent from discussion below that the voltage generated at the multi-purpose node 18 in the first mode of operation is related to a threshold voltage used by the integrated circuit 10.

The above-described low state at the output node of the second logic gate 30 also results in a high state at the output node of the inverter 36, which results in a high state at the output node of the first logic gate 38, which results in the third FET 40 being turned off.

Also in the first mode of operation, the timer 48 generates a high state, which turns on the fourth FET 50, which turns off the second FET 52, resulting in a zero current through the current sink 54.

Also during the first mode of operation, the A/D converter 24 converts the voltage appearing at the multi-purpose node 18 to a digital value, which appears at the digital output port of the A/D converter 24, and which is sent to the latch 26 for storage. The A/D converter 24 can use its own free-running clock (not shown) and clock signal during the conversion. The latch 26 can be a transparent latch that can pass the digital value to the digital input port of the D/A converter 28. The analog signal at the output node of the D/A converter 28 takes on a voltage value related to (for example, equal to) the voltage appearing upon the resistor 20. It will be appreciated that the voltage appearing at the output node of the D/A converter 28 can be scaled in any way relative to the voltage appearing on the resistor 20, and the signal appearing at the second comparator 32 from the resistor 20 can be scaled in the same way to achieve similar function. The D/A converter 28 can also use its own free-running clock (not shown) and clock signal during the conversion.

When the value at the output node of the D/A converter 28 becomes sufficiently large (e.g., equal to the voltage appearing at the resistor 20), the output of second comparator 32 reverses state, but the second logic gate 30, in some arrangements, remains disabled (i.e., low) by the high pulse state generated by the timer 48. However, in alternate arrangements, the high pulse state of the timer 48 terminates before the second comparator 32 reverses state. In these alternate arrangements, operation in the first mode terminates when the output of the second comparator 32 reverses state, instead of when the high pulse state of the timer 48 terminates.

For arrangements in which the pulse signal generated by the timer 48 keeps the second logic gate 30 disabled, the timer 48 eventually times out, resulting in a low state at the output node of the timer 48, which results in the signal at the output node of the second logic gate 30 changing to a high state. The output signal at the output node of the inverter 36 takes on a low state accordingly.

A feedback path 34 from the output of the second logic gate 30 to a control node of the second logic gate 30 essentially latches the signal at the output node of the second logic gate 30 to a high state once the high state occurs. In other arrangements, the feedback path 34 can be implemented instead by other gates that latch the signal at the output node of the second logic gate 30 to a high state once it occurs. When the signal at the output node of the second logic gate 30 transitions to the high state, the integrated circuit 10 achieves the above-described second mode of operation.

The high state at the output node of the second logic gate 30, which is coupled to the control node of the latch 26, results in the latch 26 holding (storing) a digital threshold value, which is representative of the voltage on the resistor 20 during the first mode of operation. The digital threshold value is converted to an analog threshold voltage that appears at the output node of the D/A converter 28. With this arrangement, it should be appreciated that a user is able to set a threshold used by the integrated circuit 10 by way of selection of the value of the resistor 20.

As used herein, the terms "threshold value" and "threshold voltage" refer interchangeably to either the analog threshold voltage appearing at the output node of the D/A converter 28, or to the digital threshold value generated by the A/D converter 24 and stored in the latch 26.

In the second mode of operation, the first FET 44 turns off and the third FET 40 turns on, which results in a high state at the multi-purpose node 18. When the state at the output node of the timer 48 changes to a low state beginning the second mode of operation, the fourth FET 50 turns off, putting the second FET 52 under control of the first comparator 46. Therefore, in the second mode of operation the first comparator 46 is fully active to control further operation of the integrated circuit 10.

Also in the second mode of operation, if the monitored signal appearing at the monitor node 16 is lower than the threshold voltage, which is generated at the output node of the D/A converter 28, the second FET 52 remains off, and the third FET 40 remains on, resulting in a continued high voltage at the multi-purpose node 18 due to the third FET 40 being on. In the second mode of operation, the high voltage at the multi-purpose node 18 can be indicative of no fault associated with the monitored signal.

If the monitored signal appearing at the monitor node 16 is higher than the threshold voltage, the second FET 52 turns on and the third FET 40 turns off, resulting in the current sink 54 becoming enabled to draw a current from the multi-purpose node 18. If the capacitor 22 were not present, the voltage at the multi-purpose node 18 would rapidly go to a lower voltage. However, the capacitor 22 results instead in the voltage at the multi-purpose node 18 ramping to the lower voltage. In the second mode of operation, the lower voltage at the multi-purpose node 18 can be indicative of a fault associated with the monitored signal. Therefore, the capacitor 22 tends to delay the fault indication.

The circuit 10 may be applied to monitor various analog signals in a number of applications, for which a fault detection circuit may be desirable. These applications include, but are not limited to, sensors, for example, magnetic field sensors, current sensors, Hall effect sensors, magnetoresitive sensors, accelerometers, angular rate sensors, chemical sensors, pressure sensors, and optical detectors. These applications also include, but are not limited to, actuator feedback control and motor control circuits.

Figure 2:
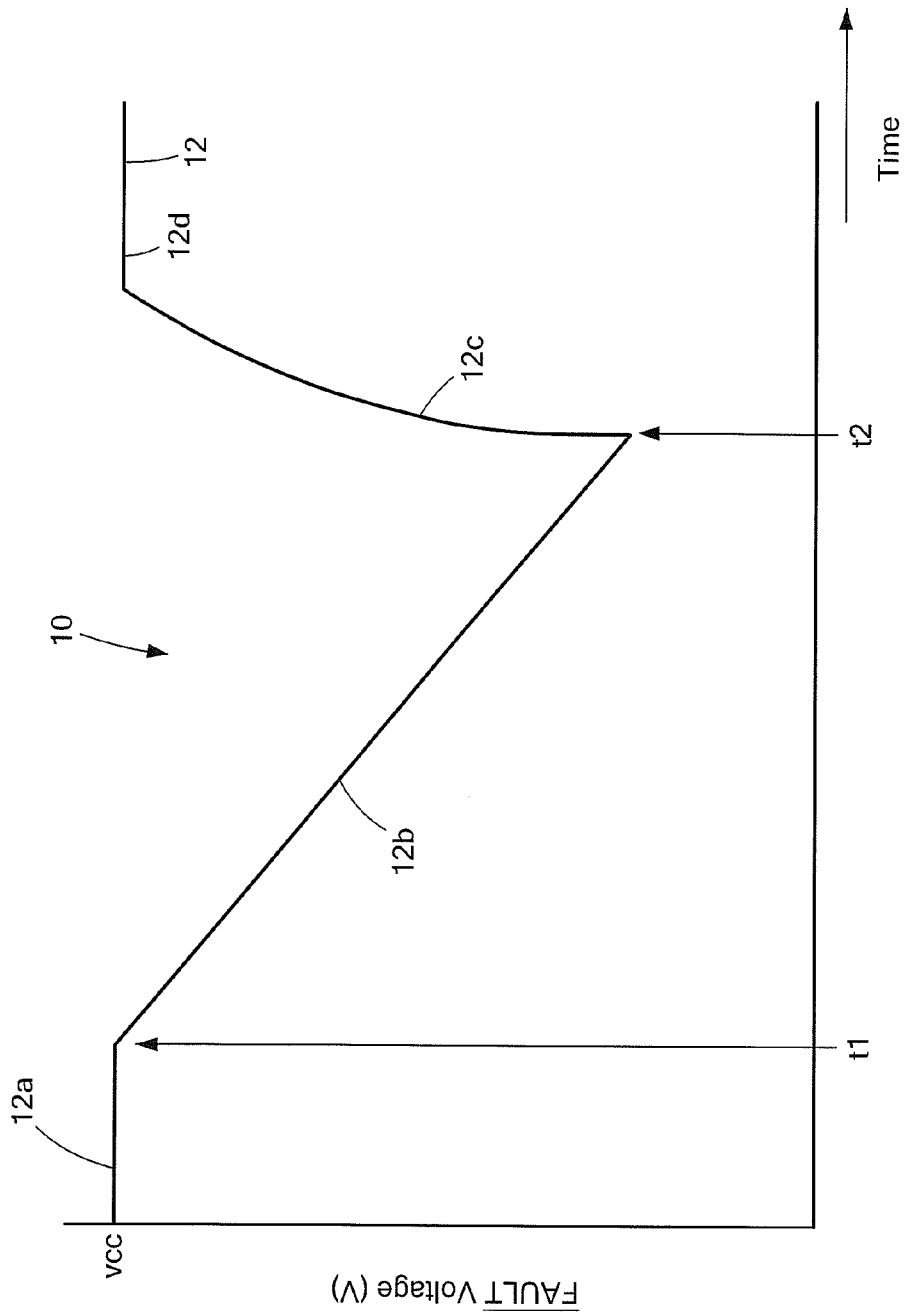
FIG. 2 is a graph showing a fault output signal at the multi-purpose node of FIG. 1, generated by the integrated fault detection circuit of FIG. 1.

Referring now to FIG. 2, a graph 10 includes a horizontal scale in units of time and a vertical scale in units of voltage. A curve 12 is indicative of the voltage appearing at the multi-purpose node 18 of FIG. 1, when the integrated circuit 10 of FIG. 1 is in the second mode of operation. The curve 12 includes a first region 12a, during which no fault is detected by the integrated circuit.

At a time t1, the integrated circuit 10 detects that the monitored signal appearing at the monitor node 16 of FIG. 1 has risen above the threshold voltage at the output node of the D/A converter 28 of FIG. 1. As described above, when this condition occurs, the current sink 54 draws current from the multi-purpose node 18, and, due to the presence of the capacitor 22, the voltage in the region 12b ramps downward with a slope related to a value of the capacitor 22.

At a time t2, the above-describe fault condition disappears, resulting in the current sink 54 becoming disconnected from the multi-purpose node 18 and the voltage in the region 12c rising as fast as the third FET 40 of FIG. 1 can supply current to the capacitor 22. In a region 12d, the multi-purpose node 18 achieves the high state, which is indicative of no fault.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An integrated circuit, comprising:
   a monitor node configured to receive a monitored signal; and
   a multi-purpose node, wherein the multi-purpose node is configured to couple to a resistor external to the integrated circuit, wherein the integrated circuit is configured to provide a predetermined current at the multi-purpose node during a predetermined time period, resulting in a resistor voltage upon the resistor during the predetermined time period, wherein the integrated circuit is further configured to sense the resistor voltage, wherein the resistor voltage is indicative of a threshold value, wherein the integrated circuit is further configured to store the threshold value, wherein the integrated circuit is further configured to output a fault signal from the multi-purpose node at a time after the predetermined time period, wherein the fault signal is indicative of a comparison between the monitored signal and the threshold value.

2. The integrated circuit of claim 1, further comprising:
   a timer circuit configured to provide a pulse signal indicative of the predetermined time period.

3. The integrated circuit of claim 2, further comprising:
   an analog-to-digital converter having an input node coupled to the multi-purpose node and having one or more output nodes, wherein the analog-to-digital converter provides, during the predetermined time period, a digital value at the one or more output nodes of the analog-to-digital converter representative of the resistor voltage;
   a latch having one or more input nodes coupled to the one or more output nodes of the analog-to-digital converter and having one or more output nodes, wherein the latch is configured to latch the digital value provided by the an analog-to-digital converter in response to the pulse signal; and a digital-to analog converter having one or more input nodes coupled to the one or more output nodes of the latch and having an output node at which the threshold value is provided.

4. The integrated circuit of claim 3, further comprising:

a comparator having a first input node coupled to receive the threshold value, having a second input node coupled to receive the monitored signal, and having an output node at which a comparator output signal is provided representative of the relationship between the monitored signal and the threshold value.

5. The integrated circuit of claim 4, further comprising:

a logic gate having a first input node coupled to receive the pulse signal and an output node coupled to the latch control node;

a current generator having first and second nodes, between which the predetermined current is provided, wherein the first node is configured to couple to a voltage source; and a FET having a drain node coupled to the second node of the current source, having a source node coupled to the multi-purpose node, and having a gate node coupled to the output node of the logic gate.

6. The integrated circuit of claim 5, wherein predetermined time period is associated with a power up of the single integrated circuit.

7. The integrated circuit of claim 6, wherein the multi-purpose node is also configured to couple to a capacitor, which is in parallel with the resistor.

8. The integrated circuit of claim 7, further comprising:

a second FET having a drain node coupled to the multi-purpose node, having a source node, and having a gale node coupled to the output node of the comparator; and a current generator having first and second nodes, between which a second predetermined current is provided, wherein the first node is coupled to the source of the second FET and the second node is configured to couple to a second voltage source.

9. A method of detecting a fault associated with a signal, comprising:

detecting with an electronic circuit a voltage at a multi-purpose node during a predetermined time period, wherein the voltage is representative of a threshold value;

storing with the electronic circuit the threshold value in response to the detecting;

monitoring with the electronic circuit a monitored signal;

comparing with the electronic circuit the monitored signal to the threshold value; and outputting from the electronic circuit a fault signal from the multi-purpose node at a time after the predetermined time period, wherein the fault signal is indicative of the comparing.

10. The method of claim 9, wherein the detecting comprises:

coupling a resistor to the multi-purpose node; and generating a predetermined current through the resistor.

11. The method of claim 10, wherein the outputting comprises:

setting the fault signal to a first state in response to the monitored signal being above the threshold value; and setting the fault signal to a second different state in response to the monitored signal being below the threshold value.

12. The method of claim 11, wherein the outputting further comprises:

coupling a capacitor to the multi-purpose node; and generating a second predetermined current through the resistor and capacitor.

* * * * *

UNITED STATES PATENT AND TRADEMARK OFFICE
CERTIFICATE OF CORRECTION

| | |
|---|---|
| PATENT NO. | : 7,552,016 B2 |
| APPLICATION NO. | : 11/755295 |
| DATED | : June 23, 2009 |
| INVENTOR(S) | : Ravi Vig et al. |

Page 1 of 1

It is certified that error appears in the above-identified patent and that said Letters Patent is hereby corrected as shown below:

Column 6, line 20 delete "above-describe" and replace with --above-described--.

Column 7, lines 1-2 delete "the an analog-to-digital" and replace with --the analog-to-digital--.

Column 7, line 28 delete "wherein predetermined" and replace with --wherein the predetermined--.

Column 7, line 36 delete "gale" and replace with --gate--.

Signed and Sealed this

Twenty-fourth Day of November, 2009

David J. Kappos
*Director of the United States Patent and Trademark Office*